US008835879B1

(12) United States Patent
Sinclair et al.

(10) Patent No.: US 8,835,879 B1
(45) Date of Patent: Sep. 16, 2014

(54) REDUCTION OF DEPOSITION BY SEPARATION OF ION BEAM AND NEUTRAL FLOW

(71) Applicant: Varian Semiconductor Equipment Associates, Inc., Gloucester, MA (US)

(72) Inventors: Frank Sinclair, Boston, MA (US); Greg Citver, Danvers, MA (US); Timothy J. Miller, Ipswich, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/908,426

(22) Filed: Jun. 3, 2013

(51) Int. Cl.
 *A61N 5/00* (2006.01)
 *G21G 5/00* (2006.01)
 *H01J 37/317* (2006.01)

(52) U.S. Cl.
 CPC .................................. *H01J 37/3171* (2013.01)
 USPC ................ 250/492.1; 250/492.2; 250/492.21;
   250/491.1; 250/423 R; 250/426; 250/396 R;
   250/492.3

(58) Field of Classification Search
 USPC ....... 250/492.1, 492.2, 492.21, 491.1, 423 R,
   250/426, 396 R, 492.3
 See application file for complete search history.

(56) References Cited

U.S. PATENT DOCUMENTS

| 2006/0080045 A1* | 4/2006 | Steiner ............................ 702/23 |
| 2008/0078949 A1* | 4/2008 | Benveniste .............. 250/492.21 |
| 2009/0114813 A1* | 5/2009 | Koo et al. ..................... 250/287 |
| 2009/0321657 A1* | 12/2009 | Satoh et al. ............... 250/423 R |

* cited by examiner

*Primary Examiner* — Jack Berman
*Assistant Examiner* — Meenakshi Sahu

(57) ABSTRACT

Ion implantation systems that separate the flow of ions from the flow of neutral particles are disclosed. The separation of neutral particles from ions can be achieved by manipulating the flow of ions in the system through variations in electrical or magnetic fields disposed within the implantation system. The path of neutral particles is less affected by electrical and magnetic fields than ions. The separation of these flows may also be accomplished by diverting the neutral particles from the ion beam, such as via an introduced gas flow or a flow blockage. Both separation techniques can be combined in some embodiments.

17 Claims, 9 Drawing Sheets

REDUCTION OF DEPOSITION BY SEPARATION OF ION BEAM AND NEUTRAL FLOW

Embodiments of the present invention relate to methods and apparatus for reducing the deposition of neutrals into substrates.

BACKGROUND

Semiconductor devices are processed by implanting ions into substrates. This processing requires tight control over the particles being directed toward the substrate. For example, in addition to the desired ions, neutral particles may be directed toward the substrate. These neutral particles may be deposited on the surface of the substrate, which may be detrimental to the ion implanting process for several reasons. First, their presence is not easily detected or controlled using traditional dosimetry techniques. In addition, these deposited neutral particles may alter the dopant/depth profile of the substrate. These neutral particles may also lead to outgassing of dopant during subsequent thermal processes.

These neutral particles reach the substrate by following the same or a similar path as the desired ions. FIG. 1 shows a representative ion implantation system, having an ion source 10, a process chamber 20, and a plurality of electrodes 30 which guide the ions along the desired path. The electrodes 30 may include suppression electrodes 31, disposed closer to the ion source 10 and ground electrodes 32, disposed away from the ion source. Additional sets of electrodes may also be utilized. In addition, each set of electrodes has a left electrode and a right electrode, with a space therebetween through which the ion beam passes. While these are referred to as left and right, they may also be upper and lower (for a horizontal ion beam). In each case, there are first and second opposed electrodes, where the ion beam passes therebetween. Thus, in FIG. 1, there are shown first and second opposed suppression electrodes 31, and first and second opposed ground electrodes 32. These electrodes 30 are in electrical communication with one or more power sources (not shown), which are used to apply an appropriate electrical voltage to each electrode 30. The positive ions are attracted through an aperture 11 toward the electrodes 30, which may be negatively charged. The aperture 11 is disposed in a wall of the ion source 10. The center of the aperture 11 serves as one end of a center line 36. The center line 36 is defined as a line perpendicular to the plane of the wall of the ion source 10 where the aperture 11 is disposed, and passing through the midpoint of the aperture 11. The ions may follow paths 35 as they travel to the substrate 40. In this embodiment, these paths 35 also are the light paths. Additionally, the electrodes 30 are disposed symmetrically about the center line 36. In addition, in this embodiment, the center line 36 also passes through the center of the substrate 40. Furthermore, in this embodiment, the central axis of the ion beam also corresponds to the center line 36.

As noted above, neutral particles may also exit the ion source 10, for example, due to pressure difference between the ion source 10 and the process chamber 20, and follow the path 36 toward the substrate 40. Also, ions in the ion source 10 can be accelerated by the early parts of the electric field, and then, while still in the high pressure of the plasma chamber, or in the throat of the aperture 11 lose their electric charge to another gas atom or molecule or by attracting an electron in the vicinity. Such a neutralized ion will be moving in generally the same direction as the ion beam, but are now neutral particles with much less energy because they have only been accelerated through a fraction of the potential drop from source to ground.

Since these neutral particles lack sufficient velocity, they are not implanted in the substrate, but rather are deposited on the surface of the substrate 40.

In addition, the plasma in the source chamber may typically a bright source of ultraviolet (UV) light. This UV light, which has sufficient quantum energy to cause chemical changes in oxides used in semiconductor devices, may be detrimental to the yield of the implantation process. The UV photons are themselves electrically neutral and are not deflected by electric fields.

Therefore, it would be beneficial if there were an apparatus and method to separate the flow of ions from the flow of neutral particles such that only ions reached the substrate. It would also be advantageous if this could be performed without the use of expensive equipment, such as mass analyzers.

SUMMARY

Ion implantation systems that separate the flow of ions from the flow of neutral particles are disclosed. The separation of neutral particles from ions can be achieved by manipulating the flow of ions in the system through variations in electrical or magnetic fields disposed within the implantation system. The path of neutral particles is less affected by electrical and magnetic fields than ions. The separation may also be accomplished by diverting the neutral particles from the ion beam, such as via an introduced gas flow or a flow blockage. Both separation techniques can be combined in some embodiments.

In one embodiment, an ion implantation system is disclosed, which comprises an ion source having an aperture disposed in a wall of the ion source; a process chamber comprising one or more electrodes, each in electrical communication with a power supply to apply a potential to each electrode, disposed in the process chamber so as to attract ions from the ion source through the aperture to form an ion beam, the ion beam directed toward a substrate disposed in the process chamber; wherein a center line is defined as a line perpendicular to the wall of the ion source and passing through a midpoint of the aperture; and wherein a configuration of the electrodes within the process chamber deflects the ion beam away from the center line, where the configuration comprises a position of each of the electrodes and a potential applied to each of the electrodes.

In a second embodiment, an ion implantation system is disclosed, which comprises an ion source having an aperture disposed in a wall of the ion source; a process chamber comprising a first electrode and a second opposed electrode, each in electrical communication with a power supply to apply a potential to each electrode, disposed in the process chamber so as to attract ions from the ion source through the aperture and toward a substrate disposed in the process chamber; wherein a center line is defined as a line perpendicular to the wall of the ion source and passing through a midpoint of the aperture; and wherein one of the first electrode or the second opposed electrode is disposed so as to block at least a portion of the aperture.

In a third embodiment, an ion implantation system is disclosed, which comprises an ion source having an aperture disposed in a wall of the ion source; a process chamber comprising one or more electrodes, each in electrical communication with a power supply to apply a potential to each electrode, disposed in the process chamber so as to attract ions from the ion source through the aperture and toward a substrate disposed in the process chamber; wherein a center line is defined as a line perpendicular to the wall of the ion source and passing through a midpoint of the aperture; and wherein a gas flow is introduced into the process chamber to push neutral particles that exit the aperture away from the center line.

BRIEF DESCRIPTION OF THE FIGURES

For a better understanding of the present disclosure, reference is made to the accompanying drawings, which are incorporated herein by reference and in which.

DETAILED DESCRIPTION

To reduce the deposition of neutral particles on the surface of the substrate, it may be necessary to separate the flow of ions from the flow of neutral particles. This may be done by understanding the mechanisms which cause each to travel toward the substrate. For example, ions may travel to the substrate due to the difference in electrical potential between the ion source and the electrodes. This path may be manipulated by the application of electrical fields in the path between the aperture in the ion source and the substrate. Based on the difference in potential, ions may reach speeds of up to 1000 Km/s.

In contrast, neutral particles may travel toward the substrate due to two different mechanisms. For example, the neutral particle flow may be similar to that of a gas and may be proportional to the difference in pressure between the ion source and the process chamber. In some embodiments, the speed of the neutral particles may be about 20 m/s at the aperture and decrease as the neutral particle travels into the process chamber, if operating in a viscous regime. The speed of the neutral particles may reach 300-500 m/s, if operating in a molecular flow regime, meaning that the density of the neutrals is sufficiently low such that their mean free path is comparable to the size of the process chamber. Neutral particles may also be affected by gas flow streamlines.

In a first set of embodiments, the path of the ions in the process chamber is manipulated due to their behavior in the presence of electrical fields. Since neutral particles are unaffected by electrical fields, the flow of neutral is less affected by these changes in electrical field.

Figure 1:
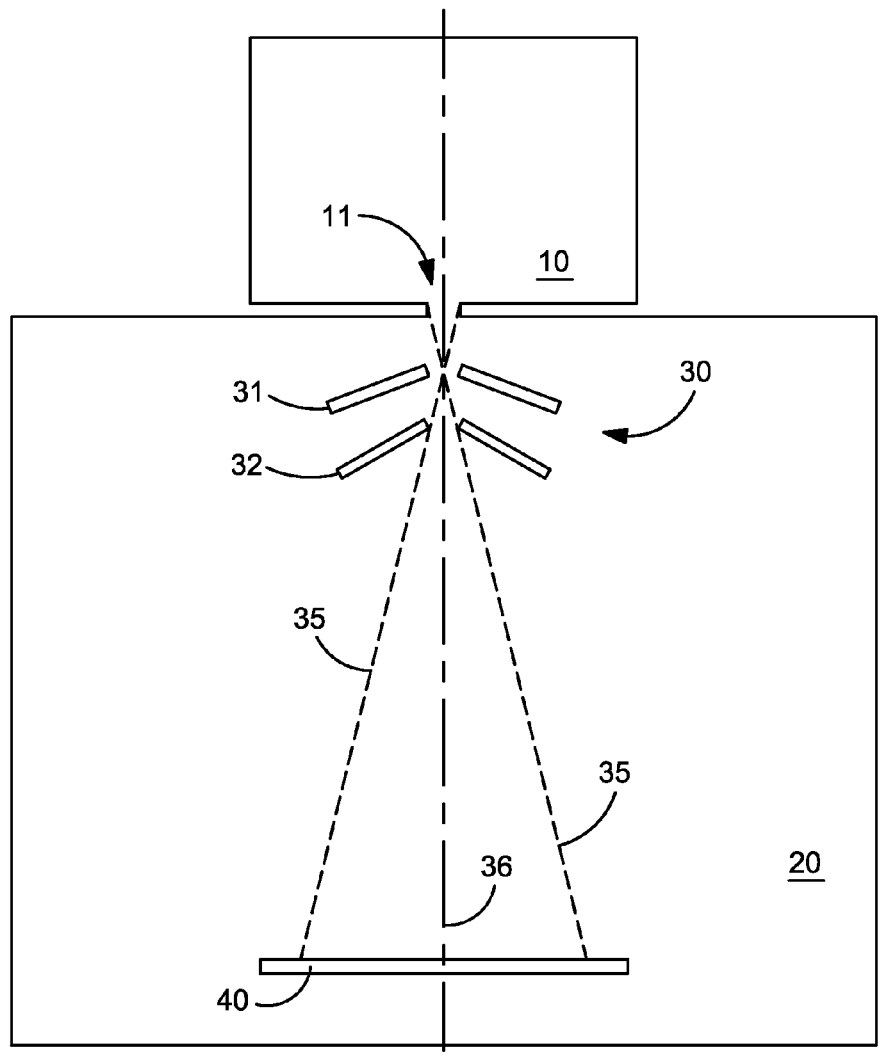
FIG. 1 shows an ion implantation system according to the prior art.
Figure 2A:
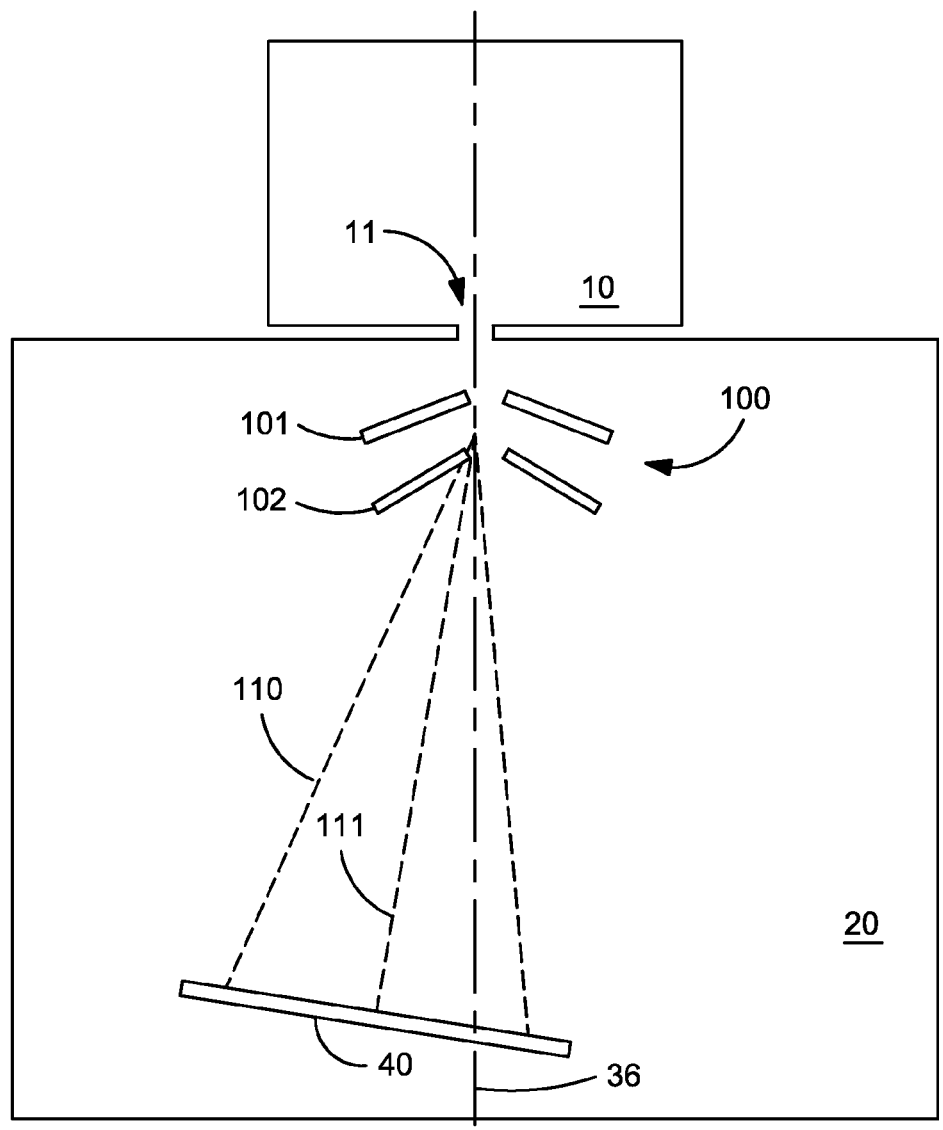
FIG. 2A shows an ion implantation system in accordance with one embodiment.

FIG. 2A shows a first embodiment in which the electrical fields are manipulated to cause a change in the path 110 of the ions. The ion path 110 has a central axis of the ion flow 111, with the ions distributed about this central axis 111. This central axis of ion flow 111 may also be referred to as the ion beam, or central axis of the ion beam. In all of the figures, components which are unchanged from FIG. 1 retain the same reference designators and are not described again. In this embodiment, all of the electrodes 100 (i.e. the suppression electrodes 101 and ground electrodes 102) are each shifted in the same direction relative to the center line 36. For example, in this embodiment, each of the electrodes 100 has been moved an equal distance to the right relative to the center line 36. As can be seen, this shift in the electrodes 100 alters the flow of ions 110, introducing a change in direction, or deflection, near the suppression electrode 101. Since the central axis of ion flow 111 is no longer aligned to the center line 36, the substrate 40 may be repositioned so as to be perpendicular to this central axis of ion flow 111. This repositioning of the substrate 40 may involve both lateral movement (i.e. the substrate 40 is moved to the left of the center line 36) and rotational movement (i.e. the substrate 40 is tilted relative to its previous position). In other words, the substrate 40 is positioned such that its center is aligned with and perpendicular to the central axis of ion flow 111. The substrate may be a semiconductor circuit, a solar cell, a light emitting diode or other semiconducting device that is processed by an ion beam 111.

While FIG. 1 shows the ion beam 111 exiting the ion source in the vertical direction, with electrodes 100 to the left and right of that beam 111, other embodiments are possible. For example, as described above, if the ion beam is horizontal, the electrodes 100 may be disposed above and below the ion beam. Thus, while the terms "left" and "right" are used, it is understand that the electrodes 100 are on opposite sides of the ion beam, which may be left and right, above and below, or variations thereof. Thus, the disclosure is not limited to a vertical beam with left and right electrodes.

As described above, the electrodes 100 may be shifted laterally relative to the center line 36. The distance that the electrodes 100 are shifted may be a function of the width of the aperture 11, and the gap between the first and second opposed electrodes. In FIG. 1, the center line 36 passed through the center of the aperture 11 and the midpoint between the first and second opposed electrodes. FIG. 2A shows the electrodes shifted such that the edge of the left electrodes are positioned on or near the center line 36. In other words, if the gap between the first and second opposed electrodes is defined as W, the electrodes 100 may be laterally shifted a distance of up to W/2. Stated differently, in FIG. 1, the center line 36 is equidistant from the electrodes 30. In this embodiment, the center line 36 is closer to the left electrodes than the right electrodes. This disparity causes the ion beam 111 to deflect toward from the left electrodes, as shown in FIG. 2A.

Figure 2B:
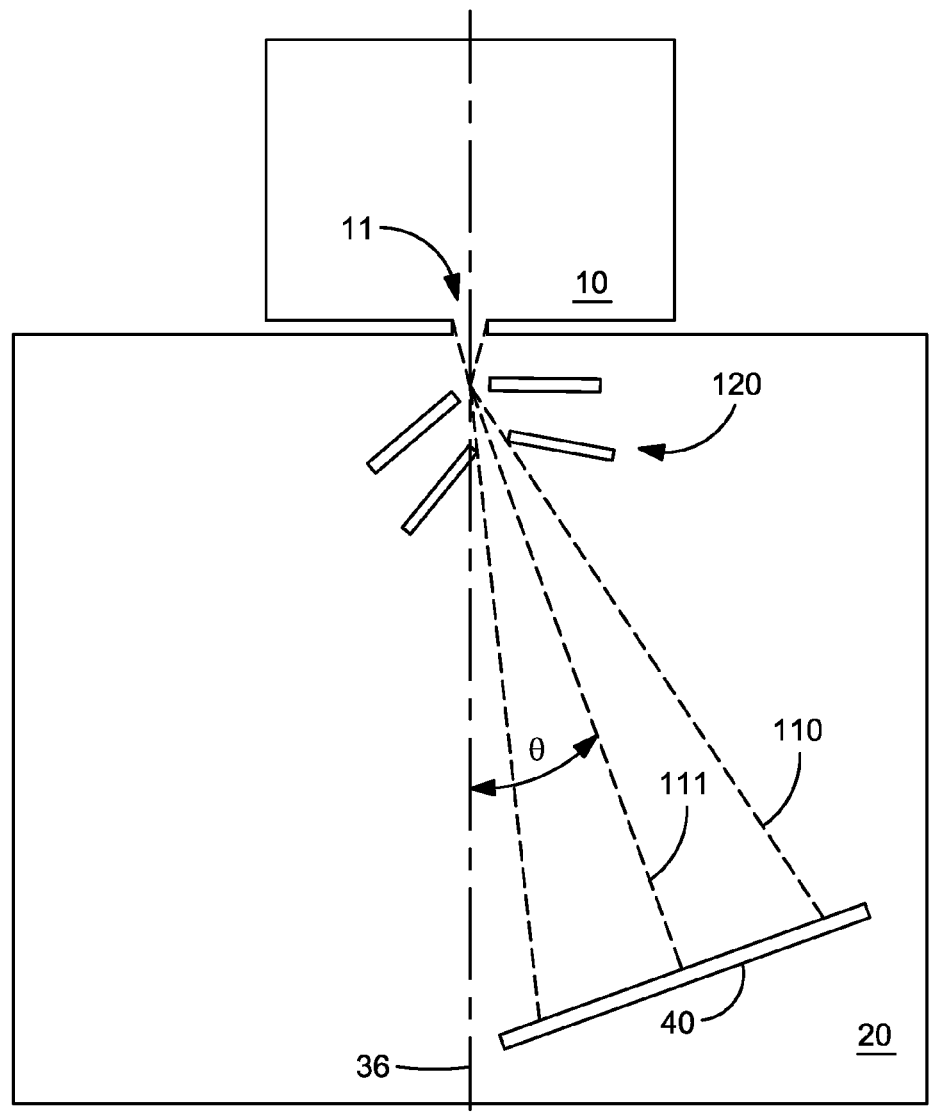
FIG. 2B shows an ion implantation system in accordance with a second embodiment.

FIG. 2B shows a second embodiment, where the electrodes 120 are rotated, or shifted angularly, relative to the center line 36. In this embodiment, the electrodes 120 are rotated an angle of θ relative to the center line 36. This rotation of the electrodes 120 causes a similar bend in the central axis of ion flow 111 and the ion flow path 110. Thus, like FIG. 2A, the substrate 40 may be repositioned both laterally and rotationally so that the center of the substrate 40 is aligned and perpendicular to the central axis 111. The electrodes 120 may be rotated any suitable angle, such as between 5° and 20°. Larger angles of rotation cause a greater deflection of the ion beam, and may cause a corresponding reduction in the amount of neutral particles that are deposited on the substrate 40. For example, a rotation of 15° may allow a 25% decrease in the amount of neutral particles that are deposited on the substrate 40. A rotation of 19° may allow as much as a 40% decrease in this deposition, while a rotation of 10° may allow only about a 15% decrease in this deposition.

Figure 2C:
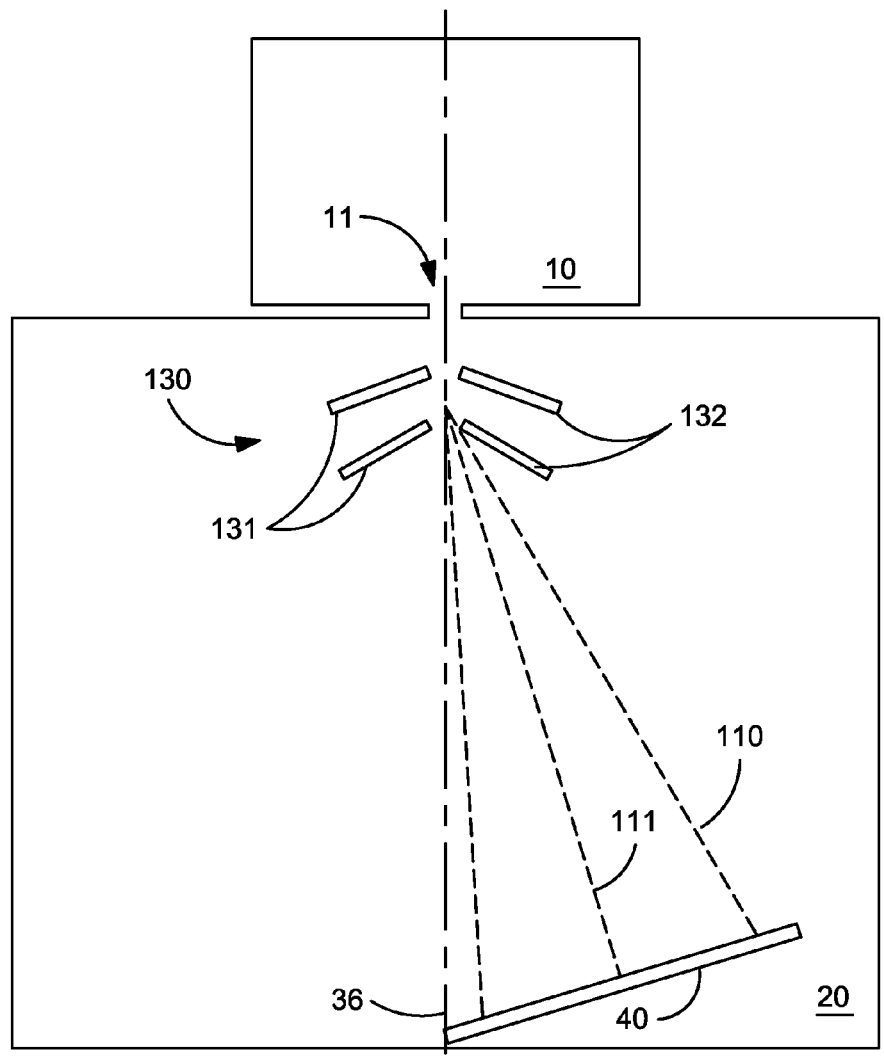
FIG. 2C shows an ion implantation system in accordance with a third embodiment.

FIG. 2C shows a third embodiment, where the electrodes 130 are positioned symmetrically about the center line 36, as was shown in FIG. 1. However, in this embodiment, different electrical potentials are applied to the first electrodes 131 and the second opposed electrodes 132. For example by applying a more positive potential to the first electrodes 131, the positive ions are deflected to the right, as shown in FIG. 2C. The magnitude of the difference in voltage may determine the amount of deflection of the central axis of the ion beam 111 and the ion path 110. For example, in one embodiment, a voltage difference of 40V may exist between the first electrodes 131 and second opposed electrodes 132. In other embodiments, other voltage differences may be used. Again, in this embodiment, the substrate 40 is repositioned both laterally and rotationally so that its center is aligned with and perpendicular to the central axis of ion flow 111. Thus, unequal electrical potentials may cause similar ion beam deflection as was caused by the lateral movement of the electrodes, shown in FIG. 2A.

It should be noted that the technique of applying different electrical potentials to the left electrodes 131 and right electrodes 132 may be used alone, as shown in FIG. 2C, or may be combined with another technique, such that the lateral shift of electrodes shown in FIG. 2A or the rotation of electrodes shown in FIG. 2B.

Figure 2D:
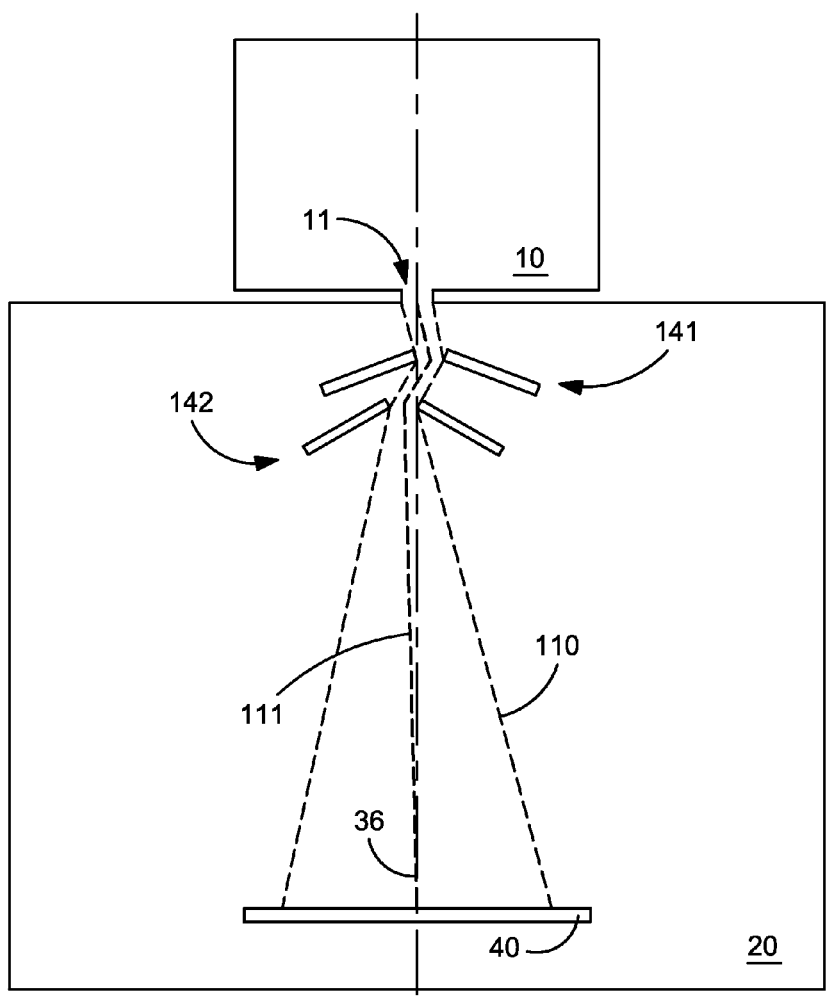
FIG. 2D shows an ion implantation system in accordance with a fourth embodiment.

FIG. 2D shows another embodiment, where the suppression electrodes 141 are shifted laterally in one direction relative to the center line 36, while the ground electrodes 142 are shifted laterally in the opposite direction. In some embodiments, only the suppression electrodes 141 or the ground electrodes 142 are shifted, while the other remains in its default position (as shown in FIG. 1). In one embodiment, the suppression electrodes 141 are shifted a distance such that the left suppression electrode may be aligned with the center line 36. The ground electrode 142 may be aligned so that the right electrode is aligned with the center line 36. In this way, there is no straight path between the aperture 11 and the substrate 40. The positions and voltages of the suppression electrodes 141 and ground electrodes 142 are configured such that the central axis 111 bends around the electrodes 141, 142 so that it may strike the substrate 40 roughly perpendicularly. Of course, this can be combined with other embodiments disclosed herein.

Figure 2E:
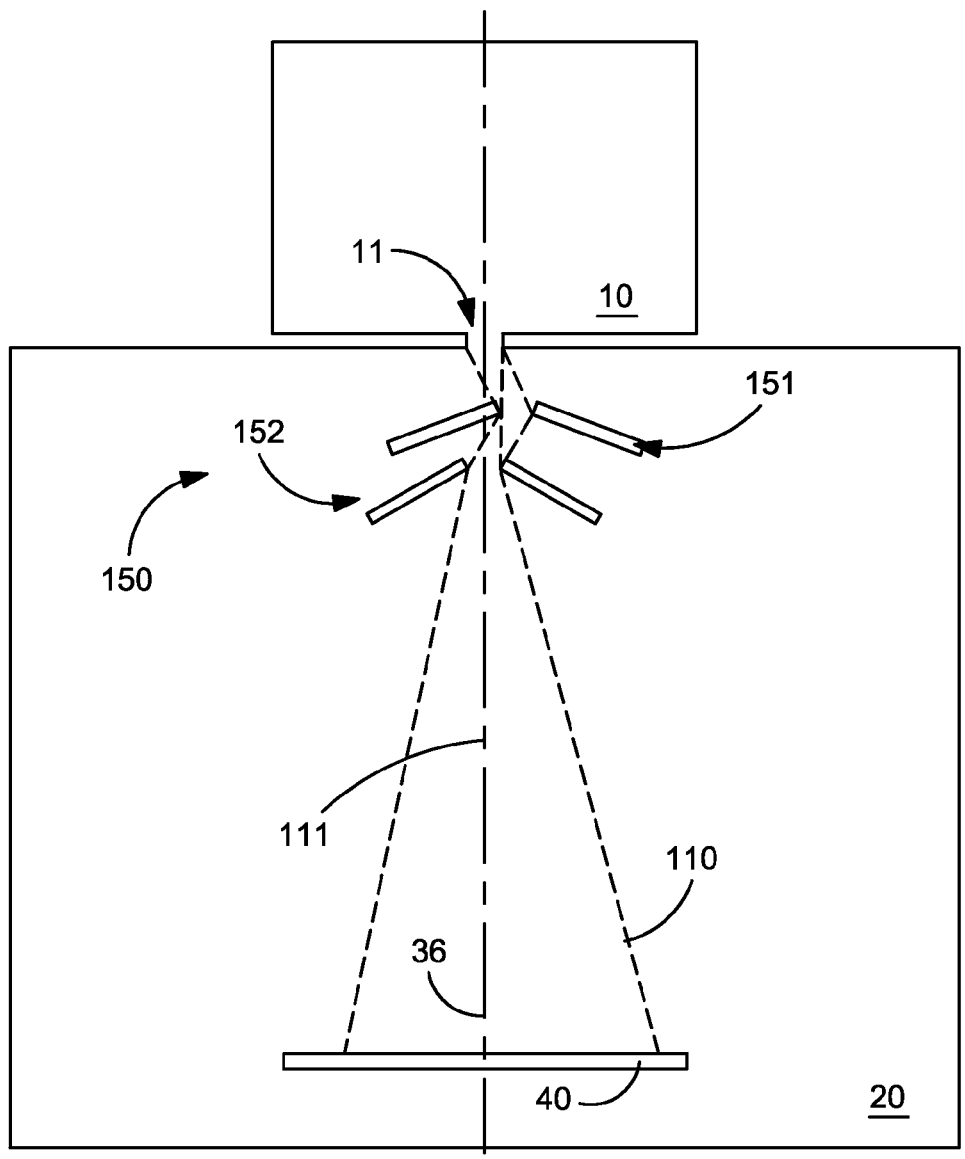
FIG. 2E shows an ion implantation system in accordance with a fifth embodiment.

FIG. 2E shows a second variation of FIG. 2D, where at least one of the suppression electrodes 151 or ground electrodes 152 is laterally shifted so as to cover the entirety of the aperture 11. Stated differently, the suppression electrodes 151 may be laterally shifted relative to the center line 36, such that the left suppression electrode is aligned with the right edge of aperture 11. Of course, the electrodes could also be shifted to the left to align the right electrode with the left edge of the aperture 11. In the embodiment shown in FIG. 2E, the ground electrodes 152 are disposed in their default position, such that the center line 36 passes through the midpoint between the left and right ground electrodes 152. However, the ground electrodes 152 may also be laterally shifted if desired. In this embodiment, the center line 36 passes through at least one of the electrodes 150, thereby shadowing or blocking neutral particles from reaching the substrate 40. In a further embodiment, at least one electrode may be disposed to block the entirety of the aperture 11. In one test, this configuration may reduce the deposition of neutral particles on the substrate 50 by about 80%.

Figure 2F:
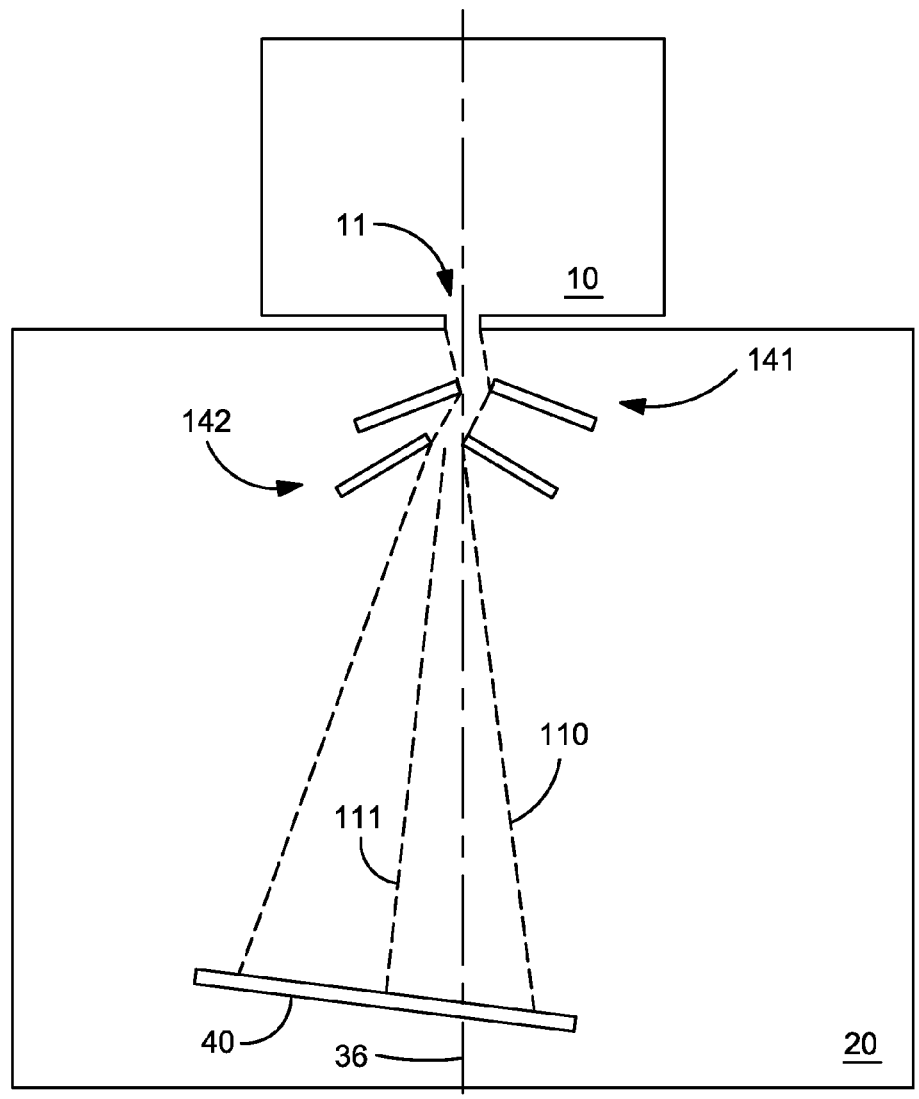
FIG. 2F shows an ion implantation system in accordance with a sixth embodiment.

FIG. 2F shows another embodiment, similar to that shown in FIG. 2D. However, in this embodiment, the central axis of the ion beam 111 is tilted relative to the center line 36. Thus, in this embodiment, the substrate 40 must be rotated and laterally repositioned to insure that the center of the substrate 40 is aligned with and perpendicular to the central axis of the ion beam 111.

In each of these embodiments, the path of the ion beam 111 is determined based on the placement of the electrodes, and the relative potential applied to each of the electrodes. Thus, configurations having similar physical configurations may generate different ion beam trajectories if different voltages are applied to the various electrodes.

Other embodiments that deflect the ion beam 111 may also be employed. For example, in one embodiment, one of more additional electrodes may be installed on one side of the central axis 111, so as to with repel or attract the ion beam in that direction. The deflection of the ion beam in this case may be similar to that shown in FIG. 2C, where a voltage difference was applied to the first and second opposed electrodes. While an additional electrode may be installed, other means which apply an electrical field that is perpendicular to the ion beam 111 may also be used.

In another embodiment, a magnetic field may be applied to the process chamber 20, which is perpendicular to the central axis 111 and the intended deflection direction.

Some embodiments, such as FIG. 2C, show the first electrodes 131 and second opposed electrodes 132 each being disposed an equal distance from the ion source 10. In another embodiment, the first electrodes 131 and second opposed electrodes 132 may be in a staggered configuration, such that the first suppression electrode or second suppression electrode is closer to the ion source 10 than the other electrode. Similarly, the ground electrodes may also be in a staggered configuration. This may also serve to deflect the ion beam 111 relative to the center line 36.

While the FIGS. 2A-2F show an electrode assembly that includes a set of suppression electrodes and a set of ground electrodes, other embodiments are possible. For example, any of these embodiments can be employed with a triode, tetrode or pentrode configuration. In other words, the number of electrodes used is not limited by this disclosure.

In each of these embodiments, modifications to the electrical fields are used to deflect the ion beam. The change in direction, or deflection, of the ion beam may be greater than that of the neutral particles, which are not affected by the electrical fields.

Thus, in each of these embodiments, an ion source 10 is disclosed having an aperture 11 in one wall of the ion source 10. The ion source 10 is proximate a process chamber 20, which includes one or more sets of electrodes, each of which is in communication with a power supply, and the substrate 40. A center line 36, is defined as the line which is perpendicular to the plane of the wall having the aperture 11, and passing through the midpoint of this aperture 11. This center line 36 defines the traditional path of ions between the ion source 10 and the substrate 40. This center line also defined the light path coming from the ion source 10, which may be the path that neutral particles preferably travel. In some of these embodiments, such as FIGS. 2A, 2B and 2F, the position of one or more electrodes is altered so as to deflect the ion beam away from this center line 36. In other embodiments, such as FIG. 2C, the potential applied to one or more electrodes is altered to deflect the ion beam away from this center line 36. In other embodiments, such as is shown in FIGS. 2D and 2E, the electrodes are positioned to block at least a portion of the aperture 11, and deflect the ion beam 111 to cause it to weave, or zigzag between the various sets of electrodes, before returning to the center line 36. Thus, these two embodiments, unlike the other figures, separates the neutral particles from the ions by blocking the path of the neutral particles moving along the center line 36. In some cases, the electrodes are disposed such that the center line 36 passes through at least one of the electrodes.

The ion beam and neutral particles may be separated in other ways as well. For example, neutral particles are more susceptible to gas flow stream lines. Thus, in a second set of embodiments, gas flow within the process chamber is modified so as to affect the flow of neutral particles.

Figure 3A:
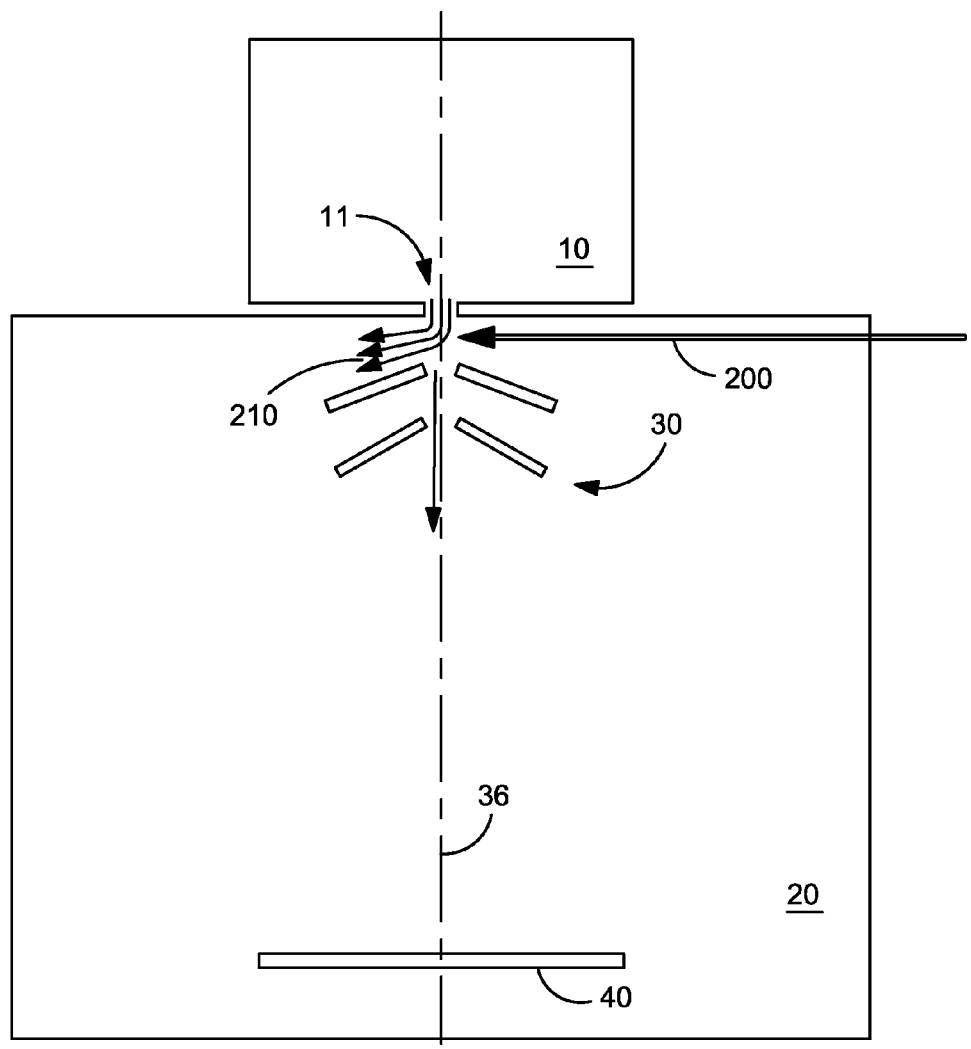
FIG. 3A shown an ion implantation system in accordance with another embodiment.

FIG. 3A shows a first embodiment, which includes the ion source 10, the process chamber 20, the electrodes 30 and the substrate 40, described above. In this embodiment, a gas flow 200 is generated. In some embodiments, this gas flow 200 is between the aperture 11 and the electrodes 30, where the ions are travelling the fastest. By applying a gas flow 200 in this region, perpendicular to the center line 36, neutral particles may be "blown" or pushed away, as shown with arrows 210.

Figure 3B:
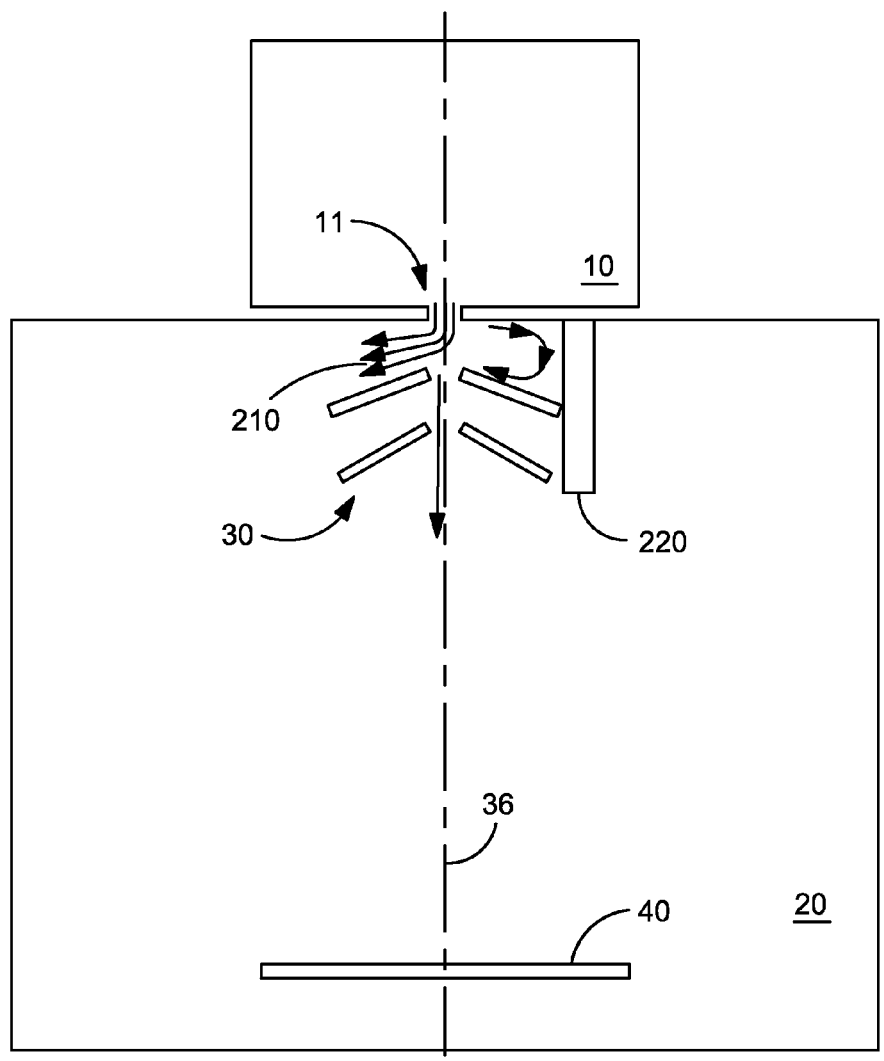
FIG. 3B shows an ion implantation system in accordance with another embodiment.

In another embodiment, the gas flow streamlines within the process chamber 20 are disrupted by the insertion of a blocking device 220, as shown in FIG. 3B. In this embodiment, a blocking device is inserted on one side of the aperture 11, thereby forcing all gas flow to move in the opposite direction, as shown by arrows 210. In some embodiments, the blocking device is disposed in the gap between the ion source 10 and the electrodes to maximize its affect on the gas flow as the neutral particles exit the aperture 11. For example, the assembly used to hold the electrodes 30 may be shaped in an asymmetric way to disturb the flow of gas through the gap between the ion source 10 and the electrodes 30.

In another embodiment, similar to FIG. 3B, the shape of the electrodes 30 may be modified to create a flow that is perpendicular to the center line 36. This may increase the probability that neutral particles are pushed away from the center line 36 and the substrate 40.

In another embodiment, the electrodes 30 may be disposed further away from the aperture 11. The increase in the width of the gap between the aperture 11 and the electrodes 30 may reduce the flow resistance in this region, thereby allowing more gas flow through this gap. This increased gas flow may serve to push the neutral particles away from the center line 36 and the substrate 40.

In another embodiment, the configuration of the process chamber 20 is altered to cause non-uniform gas flow. For example, the chamber geometry may be modified to increase hydraulic resistance to gas flow along one side, while reducing it on the opposite side of the process chamber 20. In another embodiment, the walls of the process chamber 20 are treated so as to change the wall absorption asymmetrically. This may cause a pressure gradient that serves to deflect the gas flow, and therefore the flow of neutral particles. Wall absorption may be affected by wall temperature, or wall material.

Thus, the flow of neutral particles can be separated from the ion beam through the introduction of a gas flow that is perpendicular, or at least non-parallel, to the center line 36. This introduced gas flow may serve to push or blow the neutral particles away from the center line 36, and therefore away from the substrate.

In some embodiments, a combination of separation techniques may be used. For example, a technique that deflects the ion beam (such as those shown in FIGS. 2A-2F) may be combined with a technique that pushes the neutral particles (such as those shown in FIGS. 3A-3B).

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implantation system, comprising:
an ion source having an aperture disposed in a wall of said ion source;
a process chamber comprising one or more electrodes, each in electrical communication with a power supply to apply a potential to each electrode, disposed in said process chamber so as to attract ions from said ion source through said aperture to form an ion beam, said ion beam directed toward a substrate disposed in said process chamber;
wherein a center line is defined as a line perpendicular to said wall of said ion source and passing through a midpoint of said aperture; and
wherein a configuration of said electrodes within said process chamber deflects an ion beam away from said center line, where said configuration comprises a position of each of said electrodes and a potential applied to each of said electrodes.

2. The ion implantation system of claim 1, wherein said electrodes comprise a first electrode and a second opposed electrode, and one of said first or second opposed electrode is disposed closer to said center line than another of said first or second opposed electrode.

3. The ion implantation system of claim 2, wherein a different potential is applied to said first electrode and said second opposed electrode.

4. The ion implantation system of claim 1, wherein said electrodes comprise a first electrode and a second opposed electrode, and where one of said first electrode and said second opposed electrode is disposed closer to said ion source than another of said first electrode and said second opposed electrode.

5. The ion implantation system of claim 1, wherein said electrodes comprise a first electrode and a second opposed electrode, and one of said first electrode or said second opposed electrode is disposed such that said center line passes through at least one of said first or second opposed electrode.

6. The ion implantation system of claim 5, wherein a different potential is applied to said first electrode and said second opposed electrode.

7. The ion implantation system of claim 1, wherein said electrodes comprise a first electrode and a second opposed electrode, and a different potential is applied to said first electrode and said second opposed electrode.

8. The ion implantation system of claim 1, wherein said substrate is displaced laterally from said center line.

9. The ion implantation system of claim 1, wherein said substrate is tilted relative to said center line.

10. An ion implantation system, comprising:
an ion source having an aperture disposed in a wall of said ion source;

a process chamber comprising a first electrode and a second opposed electrode, each in electrical communication with a power supply to apply a potential to each electrode, disposed in said process chamber so as to attract ions from said ion source through said aperture and toward a substrate disposed in said process chamber;

wherein a center line is defined as a line perpendicular to said wall of said ion source and passing through a midpoint of said aperture; and wherein one of said first electrode or said second opposed electrode is disposed so as to block at least a portion of said aperture.

11. The ion implantation system of claim 10, wherein said center line passes through at least one of said first or second opposed electrode.

12. The ion implantation system of claim 10, wherein said electrodes are disposed within said process chamber so as to deflect said ion beam away from said center line.

13. The ion implantation system of claim 10, wherein a different potential is applied to said first electrode and said second opposed electrode.

14. The ion implantation system of claim 10, wherein one of said first electrode and said second opposed electrode is disposed closer to said ion source than another of said first electrode and said second opposed electrode.

15. An ion implantation system, comprising:

an ion source having an aperture disposed in a wall of said ion source;

a process chamber comprising one or more electrodes, each in electrical communication with a power supply to apply a potential to each electrode, disposed in said process chamber so as to attract ions from said ion source through said aperture and toward a substrate disposed in said process chamber;

wherein a center line is defined as a line perpendicular to said wall of said ion source and passing through a midpoint of said aperture; and wherein a gas flow is introduced into said process chamber to push neutral particles that exit said aperture away from said center line.

16. The ion implantation system of claim 15, wherein gas is flowed into a gap defined between said aperture and said electrodes.

17. The ion implantation system of claim 15, wherein a blocking device is disposed in a gap defined between said aperture and said electrodes to disturb gas flow in said gap.

* * * * *